US010826522B2

(12) United States Patent
Horii

(10) Patent No.: US 10,826,522 B2
(45) Date of Patent: Nov. 3, 2020

(54) INTEGRATOR CIRCUIT FOR USE IN A SIGMA-DELTA MODULATOR

(71) Applicant: ams AG, Premstaetten (AT)

(72) Inventor: Daisuke Horii, Tokyo (JP)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/615,505

(22) PCT Filed: May 16, 2018

(86) PCT No.: PCT/EP2018/062790
§ 371 (c)(1),
(2) Date: Nov. 21, 2019

(87) PCT Pub. No.: WO2018/215266
PCT Pub. Date: Nov. 29, 2018

(65) Prior Publication Data
US 2020/0083899 A1 Mar. 12, 2020

(30) Foreign Application Priority Data
May 24, 2017 (EP) .................................... 17172740

(51) Int. Cl.
*H03M 1/12* (2006.01)
*H03M 3/00* (2006.01)

(52) U.S. Cl.
CPC ........... *H03M 3/406* (2013.01); *H03M 3/342* (2013.01); *H03M 3/368* (2013.01)

(58) Field of Classification Search
CPC ....... H03M 3/406; H03M 3/342; H03M 3/368
(Continued)

(56) References Cited

U.S. PATENT DOCUMENTS 4,896,156 A 1/1990 Gaverick
5,001,725 A 3/1991 Senderowicz et al.
(Continued)

FOREIGN PATENT DOCUMENTS

CN 102694551 2/2015
EP 0903862 A1 3/1999
(Continued)

OTHER PUBLICATIONS

Geiger Randy: "EE 435 Lecture 44 Switched-Capacitor Amplifiers Other Integrated Filters", Jan. 2008 (Jan. 1, 2008), XP55672117, Retrieved from the Internet: URL: http://class.ece.iastate.edu/ee435/lectures/EE%20435%20Lect%2044%20/ Spring%202008.pdf Spring%202008.pdf.
(Continued)

*Primary Examiner* — Peguy Jean Pierre
(74) *Attorney, Agent, or Firm* — Fish & Richardson P.C.

(57) ABSTRACT

An integrator circuit (10) for use in a sigma-delta modulator (1) comprises a differential operational amplifier (130) with a first input node (E130*a*) and a second input node (E130*b*). The first input node (E130*a*) of the differential operational amplifier (130) is connected to a first current path (101) and the second input node (E130*b*) of the differential operational amplifier (130) is connected to a second current path (102). A first controllable switch (111) is arranged between the second input node (E130*b*) of the differential operational amplifier (130) and the first current path (101). A second controllable switch (112) is arranged between the first input node (E130*a*) of the differential operational amplifier (130) and the second current path (102). A third controllable switch (113) is arranged between a reference potential (RP) and the first current path (101). A fourth controllable switch (114) is arranged between the reference potential (RP) and the second current path (102).

14 Claims, 5 Drawing Sheets

(58) Field of Classification Search
USPC ......................... 341/143, 122, 155, 144, 172
See application file for complete search history.

(56) References Cited

U.S. PATENT DOCUMENTS

| | | | | |
|---|---|---|---|---|
| 5,541,599 | A * | 7/1996 | Kasha .................. | H03M 3/368 341/122 |
| 6,204,787 | B1 * | 3/2001 | Baird .................... | H03M 3/488 341/139 |
| 6,927,720 | B2 | 8/2005 | Matsumoto | |
| 2003/0210166 | A1 | 11/2003 | Liu et al. | |
| 2006/0109153 | A1 * | 5/2006 | Gupta .................. | H03M 3/454 341/143 |
| 2011/0063146 | A1 * | 3/2011 | Matthews .............. | H03M 3/34 341/118 |
| 2012/0161994 | A1 * | 6/2012 | Quiquempoix ......... | H03F 3/005 341/143 |
| 2014/0253355 | A1 | 9/2014 | Quiquempoix | |
| 2020/0169228 | A1 | 5/2020 | Horii | |

FOREIGN PATENT DOCUMENTS

| | | |
|---|---|---|
| EP | 1755226 | 2/2007 |
| WO | 94/023502 | 10/1994 |

OTHER PUBLICATIONS

Office Action issued in European Application No. 17172740.7 dated Mar. 4, 2020, 11 pages.

Baird, R. T. et al.: "Improved Sigma Delta DAC linearity using data weighted averaging" IEEE Int. Symp. Circuits and Systems, vol. 1, May 1995, pp. 13-16.

Carley, L.R. et al.: "A 16 bit 4th order noise-shaping D/A converter" IEEE Custom Integrated Circuits Conf.(CICC), 1988, pp. 21.7.-21.7.4.

Carley, L.R:"A noise-shaping coder topology for 15+bit converters" IEEE J. Solid-State Circuits, vol. 24 No. 2, pp. 267-273, Apr. 1989.

De Bock, M. et al.:"A double-sampling cross noise-coupled split sigma delta modulation A/D converter with 80dB SNR" IEEE Int'l Conf. on Electronics, Circuits and Systems, pp. 45-48, Dec. 2009.

European Patent Office for International Search Report PCT/EP2018/062790 dated Aug. 1, 2018.

Hairapetian, A. et al.: "Multibit sigma-delta modulator with reduced sensitivity to DAC nonlinearity" Electronics Letters, vol. 27, No. 11, pp. 990-991, May 23, 1991.

Kim, M. et al.:"A 0.9V 92dB Double-Sampled Switched-RC Delta-Sigma Audio ADC" IEEE J. Solid-State Circuits, vol. 43, No. 5, May 2008.

Leslie, T.C: et al.: "An improved sigma-delta modulator architecture" IEEE Int. Symp. Circuits and Systems, vol. 1, May 1990, pp. 372-375.

Leung, B. et al.: "Multi-bit Sigma Delta A/D converters incorporating a novel class of dynamic element matching technique" IEEE Trans. Circuits Syst. 2, Analog Digit. Signal Process., vol. 39, No. 1, pp. 35-51, Jan. 1992.

Li, B. et al.:"Second Order Sigma Delta Modulator Using Semi-uniform Quantizer with 81dB Dynamic Range at 32x OSR" European Solid State Circuits Conference 2002, pp. 579-582.

Nagari, A. et al.:"A 2.7-v 11.8-mw baseband adc with 72-db dynamic range for GSM applications" IEEE J. Solid-State Circuits, vol. 35, No. 6, pp. 798-806, Jun. 2000.

Norsworthy et al., "Delta-sigma Data Converters" Jan. 1, 1996, IEEE Press. New York, XP055420022, ISBN: 978-0-470-54435-8, pp. 340-341.

Sarhang-Nejad, M. et al.:"A high-resolution multi-bit Sigma Delta ADC with digital correction and relaxed amplifier requirements" IEEE Journal of Solid-State Circuits, vol. 28, No. 6, pp. 648-660, Jun. 1993.

Senderowicz, D. et al.:"Low-voltage double-sampled sigma delta converters" IEEE J. Solid-State Circuits, vol. 32, No. 12, pp. 1907-1919, Dec. 1997.

Zhang, Z. et al: "Multi-bit Oversampled Sigma Delta A/D Converter with Nonuniform Quantization" Electronics Letters, Mar. 14, 1991, vol. 27, No. 6, pp. 528-529.

Office Action issued in U.S. Appl. No. 16/614,957, dated Jun. 24, 2020, 13 pages.

* cited by examiner

30
RP
318
p2
340
E30a
314
301
p1
SigP
p2d
360
311
310
317
p1d
330
A330a
A30a
A30b
A330b
316
p1d
370
p2d
312
SigN
315
302
p1
E30b
350
319
p2
RP

10
RP
113
pR
140
E10a
p2d
P101
p1
SigP
117
101
160
115
119
p2
111
110
p1d
130
E130a
A130a
A10a
p1d
E130b
A10b
A130b
120
118
p2
112
102
170
116
SigN
p2d
P102
p1
E10b
150
114
pR
RP $p_{ref1} = d \cdot p_{1d} + d \cdot p_{2d}$ $p_{ref2} = d \cdot p_{1d} + d \cdot p_{2d}$ (d: digital output, 0 or 1)

INTEGRATOR CIRCUIT FOR USE IN A SIGMA-DELTA MODULATOR

TECHNICAL FIELD

The disclosure relates to an arrangement of switched capacitor circuits, particularly used as integrator circuits in a sigma-delta modulator (SDM).

BACKGROUND

Sigma-delta modulators are widely used in several electronic applications today. A sigma-delta modulator receives an analog input signal at an input terminal and outputs a digital value proportional to the analog input signal. The sigma-delta modulator comprises an integrator and a multi-bit quantizer in a forward path and a multi-bit digital-to-analog converter in a feedback loop. The sigma-delta modulator usually uses a sampling switched capacitor (SC) integrator in the forward path of the modulator, if the modulator uses an arrangement of switched capacitor circuits.

It is desired to provide an integrator circuit for use in a sigma-delta modulator being configured as an arrangement of switched capacitor circuits, wherein the integrator circuit has a low noise, a small area consumption and is robust against capacitor mismatch.

SUMMARY

An integrator circuit for use in a sigma-delta modulator having low noise performance, being robust against capacitor mismatch, wherein the integrator circuit can be realized on a small area, is specified in claim 1.

The integrator circuit comprises a first current path having a first signal input terminal to apply a first input signal, and a second current path having a second signal input terminal to apply a second input signal. The integrator circuit further comprises a differential operational amplifier with a first input node and a second input node. The first input node of the differential operational amplifier is connected to the first current path and the second input node of the differential operational amplifier is connected to the second current path.

The integrator circuit comprises a first controllable switch being arranged between the second input node of the differential operational amplifier and the first current path. The integrator circuit further comprises a second controllable switch being arranged between the first input node of the differential operational amplifier and the second current path. The integrator circuit comprises a third controllable switch being arranged between a reference potential and the first current path, and a fourth controllable switch being arranged between the reference potential and the second current path.

DETAILED DESCRIPTION

Figure 1:
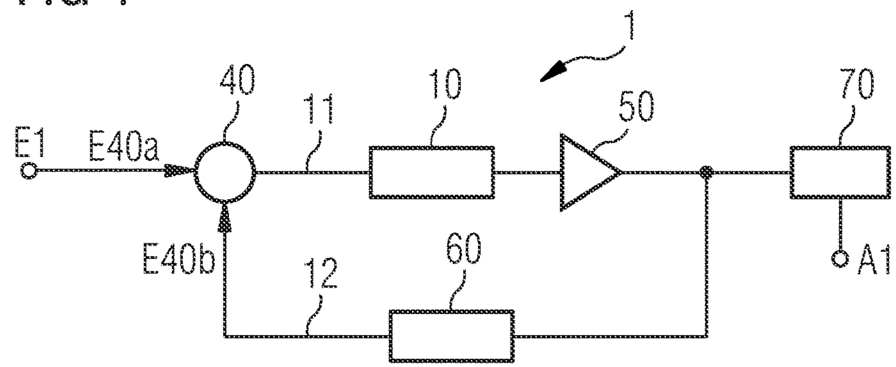
FIG. 1 shows an embodiment of a sigma-delta modulator using an arrangement of switched capacitor circuits.

FIG. 1 shows an embodiment of a sigma-delta modulator that uses an arrangement of switched capacitor (SC) circuits. The sigma-delta modulator 1 comprises an input terminal E1 to apply an analog input signal and an output terminal A1 to output a data word that is dependent from the analog input signal. The sigma-delta modulator 1 comprises a forward path 11 and a feedback path 12. The forward path 11 comprises an integrator circuit 10, 20 or 30, a summation block 40 and a multi-bit quantizer 50. The feedback path 12 comprises a digital-to-analog converter 60. The summation block 40 has a first input node E40*a* being connected to the input terminal E1 of the modulator and an input node E40*b* being connected to the feedback path 12 to receive an output signal of the digital-to-analog converter 60.

The integrator circuit may be configured as a fully-floating double-sampling switched capacitor (SC) circuit. A fully-floating double-sampling switched capacitor circuit is a well-known configuration, because it is simple and robust against capacitor mismatch.

Figure 2:
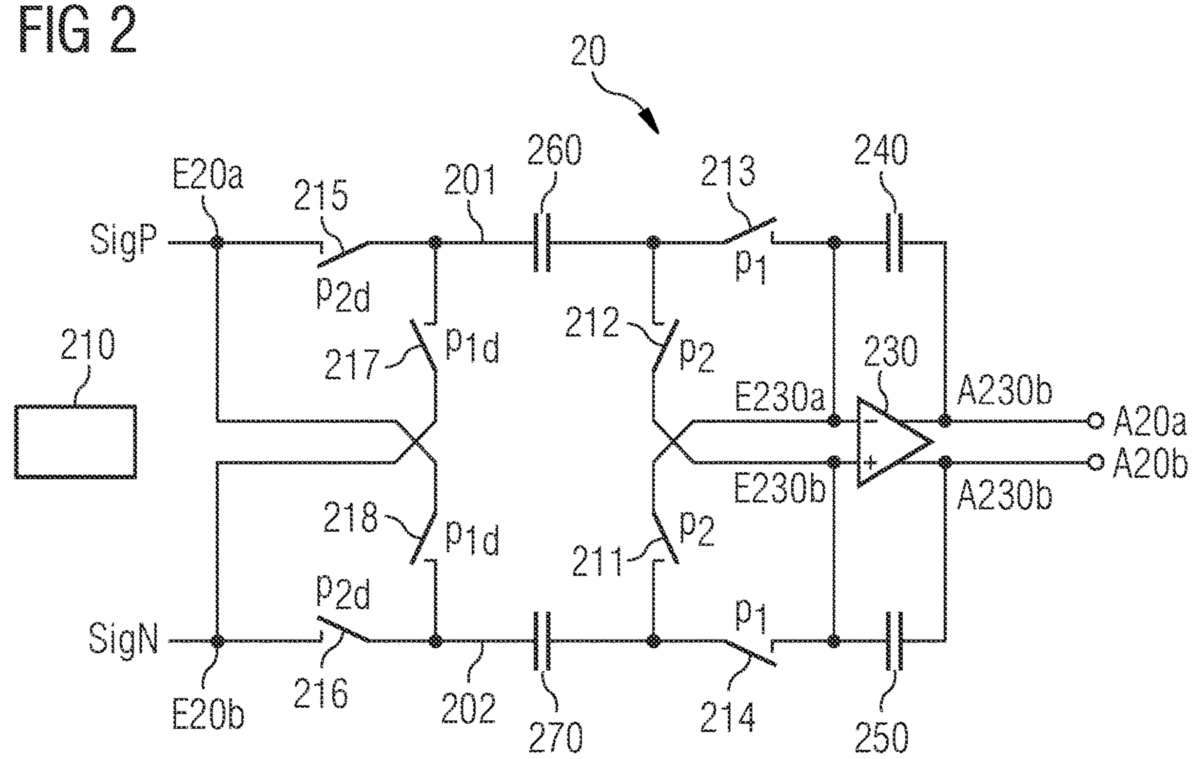
FIG. 2 shows an embodiment of a fully floating double sampling SC integrator.

FIG. 2 shows the schematic of a fully-floating double-sampling SC integrator 20 that may be used as integrator circuit in the sigma-delta modulator 1. The fully-floating double-sampling SC integrator 20 shown in FIG. 2 comprises a signal input terminal E20*a* to apply an input signal SigP and a signal input terminal E20*b* to apply an input signal SigN. The integrator circuit 20 comprises a differential operational amplifier 230 having output nodes A230*a* and A230*b* that are connected to an output terminal A20*a* and an output terminal A20*b* of the SC integrator 20. An input node E230*a* of the differential operational amplifier 230 is connected via a controllable switch 211 to a current path 202 of the integrator circuit 20. An input node E230*b* of the differential operational amplifier 230 is connected via a controllable switch 212 to a current path 201.

The current path 201 comprises an integrating capacitor 240, a controllable switch 213, a sampling capacitor 260 and a controllable switch 215. The current path 202 comprises an integrating capacitor 250, a controllable switch 214, a sampling capacitor 270 and a controllable switch 216. The signal input terminal E20*a* to apply the input signal SigP may be connected to the current path 202 via a controllable switch 218. The signal input terminal E20*b* to apply the input signal SigN may be connected to the current path 201 via a controllable switch 217.

Figure 5:
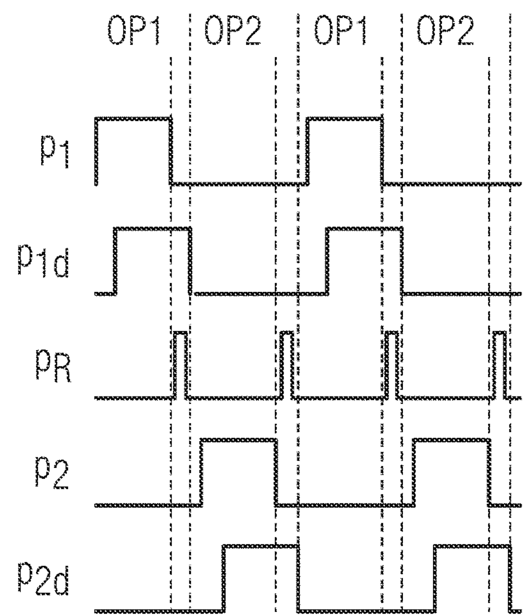
FIG. 5 shows signal sequences of switching signals to control controllable switches of an integrator circuit for use in a sigma-delta modulator.

The controllable switches 211, . . . , 218 may be controlled by a switching controller 210 that generates switching signals p1, p1*d*, p2 and p2*d*. The switching signals p1 and p2 are non-overlapped clocks while the switching signals p1*d* and p2*d* are delayed clocks of the switching signals p1 and p2. The signal sequences of the switching signals p1, p1*d*, p2 and p2*d* are illustrated in FIG. 5 for subsequent operational phases OP1 and OP2.

FIG. 2 shows the controllable switches 211, . . . , 218 with the associated switching signals. The controllable switches 211 and 212 are controlled by the switching signal p2. The controllable switches 213 and 214 are controlled by the switching signal p1. The controllable switches 215 and 216 are controlled by the switching signal p2*d*. The controllable switches 217 and 218 are controlled by the switching signal p1*d*.

A major drawback of the configuration of the integrator circuit 20 is that it cannot be used alone because the input nodes E230*a*, E230*b* of the differential operational amplifier 230 are not biased properly without any DC path. So, the configuration of the integrator circuit 20 of FIG. 1 is usually used in combination with a classical SC integrator.

Another problem of the configuration of the integrator circuit 20 is its noise performance. At the end of the operational phase OP1 (or OP2), noise charge from the switches and OTA, so-called kT/C noise, appears at the output and is integrated in the integrating capacitors 240, 250 at the same time as the noise is stored at the sampling capacitors 260 and 270. After that, the stored noise charge is transferred into the integrating capacitors 240 and 250 at the next operational phase OP2 (or OP1). This means that all device noise from the controllable switches and the differential operational amplifier is integrated twice. This noise correlation causes two times larger noise gain in the voltage domain and four times larger gain in the power domain.

Figure 3:
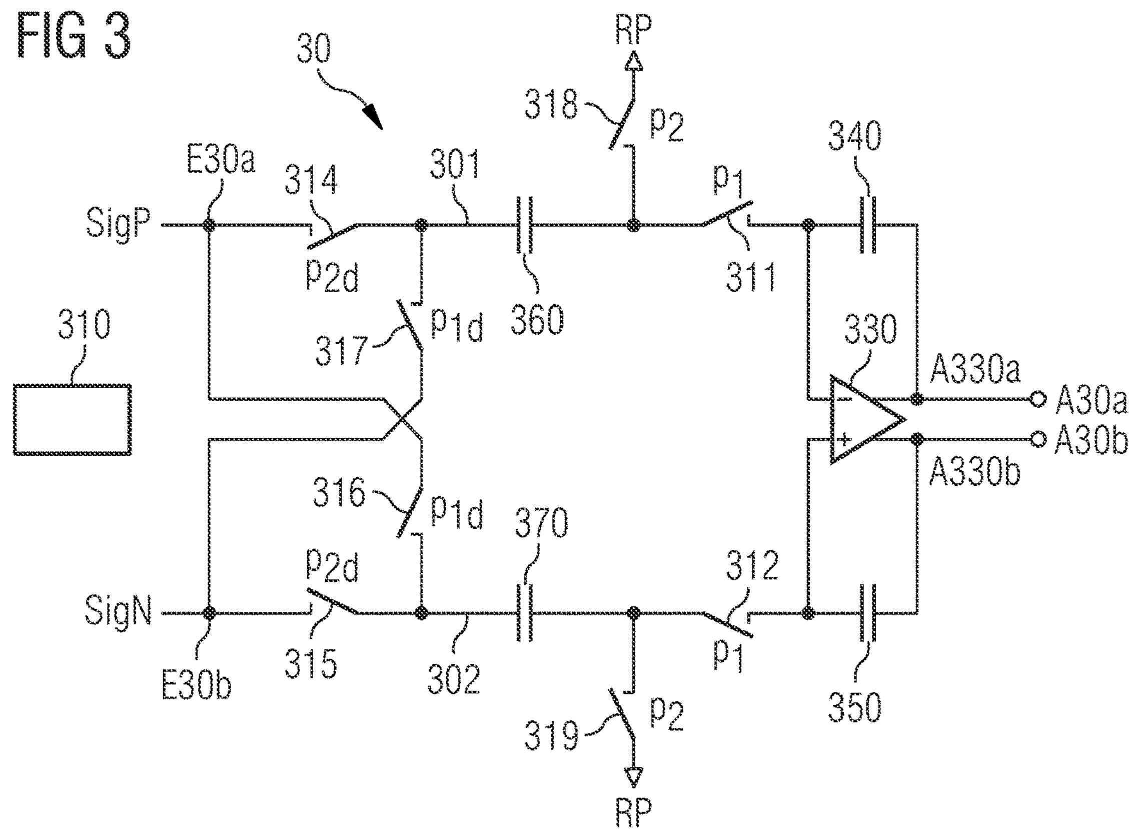
FIG. 3 shows an embodiment of a conventional double sampling SC integrator.

FIG. 3 shows an embodiment of a conventional double-sampling SC integrator 30 that can be used as integrator circuit 30 in the sigma-delta modulator 1. The integrator circuit 30 has a signal input terminal E30*a* to apply an input signal SigP and a signal input terminal E30*b* to apply an input signal SigN. The integrator circuit 30 further comprises a differential operational amplifier 330 having an input side with an input node E330*a* and an input node E330*b*. The input node E330*a* is connected to a current path 301 and the input node E330*b* of the differential operational amplifier 330 is connected to the current path 302.

The integrator circuit 30 comprises an output terminal A30*a* and an output terminal A30*b* to generate an output signal between the output terminals. The output terminal A30*a* is connected to an output node A330*a* of the differential operational amplifier 330. The output terminal A30*b* is connected to an output node A330*b* of the differential operational amplifier 330. The input node E330*a* and the output node A330*a* are coupled via an integrating capacitor 340 that is arranged in the current path 301. The input node E330*a* and the output node A330*b* of the differential operational amplifier 330 are connected via an integrating capacitor 350 being arranged in the current path 302.

The current path 301 comprises controllable switches 311 and 314 and a sampling capacitor 360. A controllable switch 318 is arranged between a reference potential RP and the current path 301. The current path 302 comprises controllable switches 312 and 315 as well as a sampling capacitor 370. A controllable switch 319 is connected between a reference potential RP and the current path 302. The signal input terminal E30*a* to apply the input signal SigP is connected via a controllable switch 316 to the current path 302. The signal input terminal E30*b* to apply the input signal SigN is connected to the current path 301 via the controllable switch 317.

The controllable switches 311, . . . , 319 are controlled by switching signals p1, p1*d*, p2 and p2*d* that are generated from a switching controller 310. FIG. 3 shows the controllable switches and their respective associated switching signals. The signal sequences of the switching signals p1, p1*d*, p2 and p2*d* are illustrated in FIG. 5.

Compared to the conventional double-sampling SC integrator circuit 30 shown in FIG. 3, the fully-floating double-sampling SC integrator circuit 20 of FIG. 2 has two times larger signal gain at one period with the same capacitor size but kT/C noise at the output is more than twice as large in the voltage domain. As a result, the signal-to-noise ratio (SNR) of the fully-floating double-sampling SC integrator circuit 20 is slightly worse than that of the conventional SC integrator 30.

Figure 4:
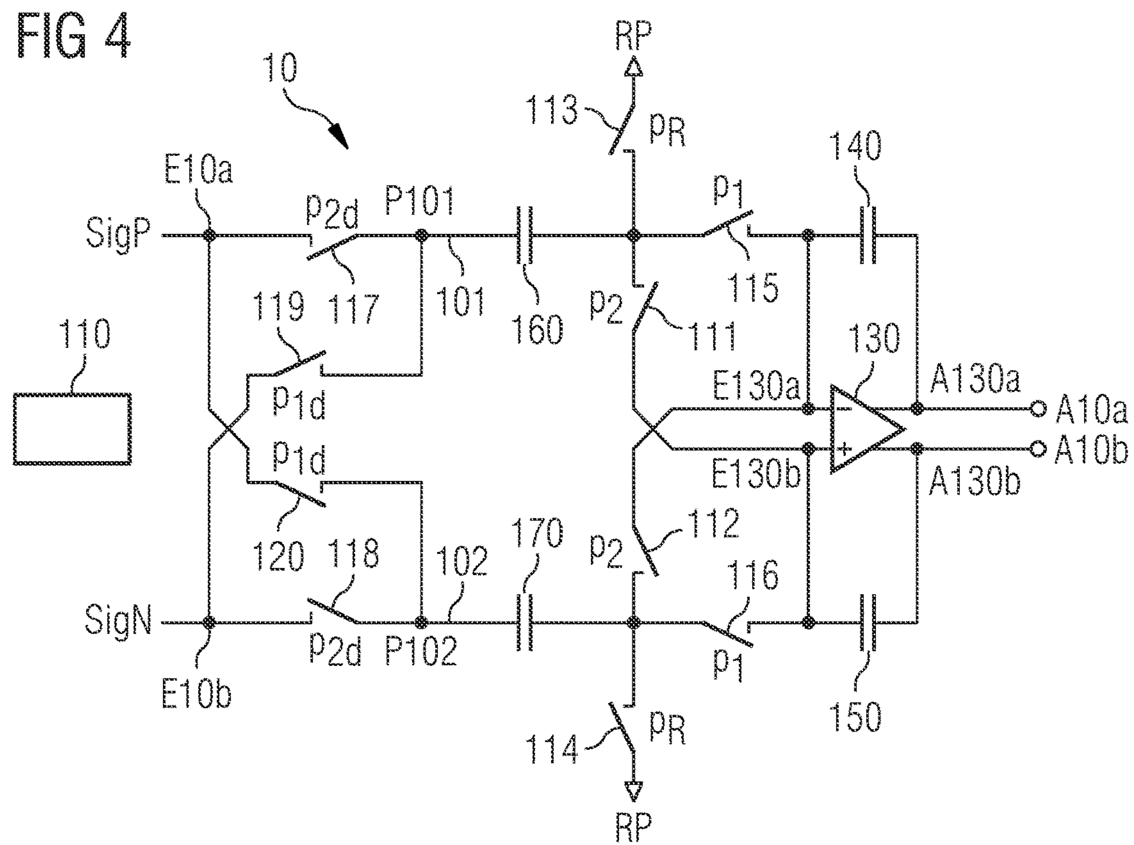
FIG. 4 shows an embodiment of an integrator circuit for use in a sigma-delta modulator comprising noise reset switches.

FIG. 4 shows an embodiment of an integrator circuit 10 for use as integrator circuit in the forward path 11 of the sigma-delta modulator 1. The integrator circuit 10 comprises a current path 101 having a signal input terminal E10*a* to apply an input signal SigP, and a current path 102 having a signal input terminal E10*b* to apply an input signal SigN. The integrator circuit 10 comprises a differential operational amplifier 130 having an input side with an input node E130*a* and an input node E130*b*. The input node E130*a* of the differential operational amplifier 130 is connected to the current path 101. The input node E130*b* of the differential operational amplifier 130 is connected to the current path 102.

The integrator circuit comprises a controllable switch 111 being arranged between the input node E130*b* of the differential operational amplifier 130 and the current path 101. The integrator circuit comprises a controllable switch 112 being arranged between the input node E130*a* of the differential operational amplifier 130 and the current path 102. The integrator circuit 10 comprises a controllable switch 113 being arranged between a reference potential RP and the current path 101. The integrator circuit 10 further comprises a controllable switch 114 being arranged between the reference potential RP and the current path 102.

The integrator circuit 10 comprises an output terminal A10*a* and an output terminal A10*b* to generate an output signal between the output terminals A10*a* and A10*b*. The integrator circuit 10 comprises an integrating capacitor 140 and an integrating capacitor 150. The differential operational amplifier 130 has an output node A130*a* being connected to the output terminal A10*a* and an output node A130*b* being connected to the output terminal A10*b*. The integrating capacitor 140 is arranged between the input node E130*a* and the output node A130*a* of the differential operational amplifier 130. The integrating capacitor 150 is arranged between the input node E130*b* and the output node A130*b* of the differential operational amplifier 130.

The integrator circuit 10 further comprises a sampling capacitor 160 and a sampling capacitor 170. The sampling capacitor 160 is arranged in the current path 101 between the signal input terminal E10*a* and the integrating capacitor 140. The sampling capacitor 170 is arranged in the current path 102 between the signal input terminal E10*b* and the integrating capacitor 150. The integrator circuit 10 comprises a controllable switch 115 and a controllable switch 116. The controllable switch 115 is arranged in the current path 101 between the integrating capacitor 140 and the sampling capacitor 160. The controllable switch 116 is arranged in the current path 102 between the integrating capacitor 150 and the sampling capacitor 170.

The integrator circuit 10 further comprises a controllable switch 117 and a controllable switch 118. The controllable switch 117 is arranged between the signal input terminal E10*a* and the sampling capacitor 160. The controllable switch 118 is arranged between the signal input terminal E10*b* and the sampling capacitor 170. The integrator circuit 10 comprises a controllable switch 119 and a controllable switch 120. The controllable switch 119 is arranged between the signal input terminal E10*b* and a position P101 of the current path 101.

The position P101 of the current path 101 is located between the controllable switch 117 and the sampling capacitor 160. The controllable switch 120 is arranged between the signal input terminal E10*a* and a position P102 of the current path 102. The position P102 of the current path 102 is located between the controllable switch 118 and the sampling capacitor 170.

The integrator circuit 10 comprises a switching controller 110 being configured to control one of a conductive and non-conductive switching state of the controllable switches 111, . . . , 120 by generating switching signals p1, p1*d*, p2, p2*d* and pR during the first operational phase OP1 and the subsequent second operational phase OP2 of the integrator circuit 10.

FIG. 5 shows signal sequences of the switching signals p1, p1*d*, p2, p2*d* and pR during the subsequent operational phases OP1 and OP2. The switching signals p1, p1*d*, p2 and p2*d* are used to control the controllable switches of the integrator circuits 20 and 30. The switching signals p1, p1*d*, p2, p2*d* and pR are used to control the controllable switches of the integrator circuit 10 of FIG. 4. As shown in FIG. 5, the signal sequences p1 and p2 are configured as non-overlapping clocks, while the signal sequences p1*d* and p2*d* are delayed versions of the signal sequences p1 and p2.

The switching controller 110 is configured to generate the switching signal p1 with a first level, for example a high level, during a first period of the first operational phase OP1, and a delayed switching signal p1*d* with the first level being delayed in relation to the first level of the switching signal p1 during a second period of the first operational phase OP1. The first period terminates after the beginning and before the end of the second period. The second period begins during the first period and terminates after the end of the first period of the first operational phase OP1.

That means that the second period is subsequent to the first period and the first and the second period overlap each other. The switching signals p1 and p1*d* are configured as overlapping signals. The switching controller 110 is configured to generate the switching signal p1 and the delayed switching signal p1*d* with a respective second level, for example a low level, during the second operational phase OP2 of the integrator circuit.

As illustrated in FIG. 5, the switching controller 110 is configured to generate the switching signal p1 with a signal sequence of a first and a second signal level, for example a high and a low level. The signal sequence of the switching signal p1 has the first level, for example the high level, from a first instant of time of the first operational phase OP1 at the beginning of the first operational phase or after the beginning of the first operational phase until a second instant of time of the first operational phase OP1 before the instant of time of the end of the first operational phase. The switching signal p1 has the second level, for example the low level, from the second instant of time of the first operational phase OP1 until the instant of time of the end of the first operational phase and during the second operational phase.

The switching controller 110 is configured to generate the switching signal p1*d* with a signal sequence of a first and a second signal level, for example the high and the low level. The switching signal p1*d* is generated by the switching controller 110 with the first level, for example the high level, from a third instant of time of the first operational phase OP1 being after the first instant of time of the first operational phase until the instant of time of the end of the first operational phase OP1. The switching signal p1*d* is generated by the switching controller 110 with the second level, for example the low level from the beginning of the first operational phase OP1 until the third instant of time of the first operational phase OP1 and during the second operational phase OP2.

The controllable switches 115 and 116 are configured to be controlled by the switching signal p1. The controllable switches 115 and 116 are configured to be operated in a conductive state, when the switching signal p1 is generated by the switching controller 110 with the first level. The controllable switches 115 and 116 are configured to be operated in the non-conductive state, when the switching signal p1 is generated by the switching controller 110 with the second level.

The controllable switches 119 and 120 are configured to be controlled by the delayed switching signal p1*d*. The controllable switches 119 and 120 are configured to be operated in a conductive state, when the delayed switching signal p1*d* is generated by the switching controller 110 with the first level. The controllable switches 119 and 120 are operated in the non-conductive state, when the delayed switching signal p1*d* is generated by the switching controller 110 with the second level.

The switching controller 110 is configured to generate the switching signal p2 with the first level, for example the high level, during a first period of the second operational phase OP2, and the delayed switching signal p2*d* with the first level being delayed in relation to the first level of the switching signal p2 during a second period of the second operational phase OP2. The first period terminates after the beginning and before the end of the second period. The second period begins during the first period and terminates after the end of the first period. That means that the second period of the second operational phase Op2 is subsequent to the first period of the second operational phase OP2, and the first and the second period of the second operational phase Op2 overlap each other. The switching signals p2 and p2*d* are configured as overlapping signals. The switching controller 110 is configured to generate the switching signal p2 and the delayed switching signal p2*d* with the respective second level, for example the low level, during the first operational phase OP1 of the integrator circuit 10.

As illustrated in FIG. 5, the switching controller 110 is configured to generate the switching signal p2 with a signal sequence of the first and the second signal levels, for example the high and the low level. The switching signal p2 has the first level, for example the high level, from a first instant of time of the second operational phase OP2 at the beginning of the second operational phase or after the beginning of the second operational phase until a second instant of time of the second operational phase OP2 before the instant of time of the end of the second operational phase. The switching controller 110 generates the switching signal p2 with the second level, for example the low level, from the second instant of time of the second operational phase OP2 until the instant of time of the end of the second operational phase OP2 and during the first operational phase OP1.

The switching controller 110 is configured to generate the switching signal p2*d* with a signal sequence of the first and the second signal level, for example the high and the low level. The switching signal p2*d* has the first level, for example the high level, from a third instant of time of the second operational phase OP2 being after the first instant of time of the second operational phase OP2 until the instant of time of the end of the second operational phase OP2. The switching signal p2*d* has the second level, for example the low level, from the beginning of the second operational phase OP2 until the third instant of time of the second operational phase OP2 and during the first operational phase OP1.

The controllable switches 111 and 112 are configured to be controlled by the switching signal p2. The controllable switches 111 and 112 are configured to be operated in a conductive state when the switching signal p2 is generated by the switching controller 110 with the first level. The controllable switches 111 and 112 are configured to be operated in the non-conductive state, when the switching signal p2 is generated by the switching controller 110 with the second level.

The controllable switches 117 and 118 are configured to be controlled by the delayed switching signal p2*d*. The controllable switches 117 and 118 are configured to be operated in a conductive state when the delayed switching signal p2*d* is generated by the switching controller 110 with the first level. The controllable switches 117 and 118 are configured to be operated in the non-conductive state, when the delayed switching signal p2*d* is generated by the switching controller 110 with the second level.

The switching controller 110 is configured to generate a switching signal pR with a signal sequence of the first and the second signal level, for example the low and the high level. The switching signal pR has the first level, for example the high level, between the second instant of time of the first operational phase OP1 and the instant of time of the end of the first operational phase OP1 and between the second instant of time of the second operational phase OP2 and the end of the second operational phase OP2, and otherwise has the second level, for example the low level.

The switching controller 110 is configured to generate the switching signal pR with the first level during the first operational phase OP1, when the switching signal p1 is generated with the second level, for example the low level, and the delayed switching signal p1*d* is generated with the first level, for example the high level, and is otherwise generated during the first operational phase OP1 with the second level. The switching controller 110 is configured to generate the switching signal pR with the first level during the second operational phase OP2, when the second switching signal p2 is generated with the second level, for example the low level, and the delayed switching signal p2*d* is generated with the first level, for example the high level, and is otherwise generated during the second operational phase OP2 with the second level.

The controllable switches 113 and 114 are configured to be controlled by the switching signal pR. The controllable switches 113 and 114 are configured to be operated in a conductive state when the switching signal pR is generated by the switching controller 110 with the first level and to be operated in the non-conductive state when the switching signal pR is generated by the switching controller 110 with the second level.

The controllable switches 113 and 114 of the configuration of the integrator circuit 10 are effective as noise reset switches between the input nodes E130*a* and E130*b* of the differential operational amplifier 130 and analog ground in order to avoid the noise correlation. The switching signal pR to control the controllable switches 113 and 114 can be realized by adding some logic cells into the switching controller 110, for example an existing non-overlapping clock generator. Since the virtual ground and analog ground are at the same voltage, the controllable switches 113 and 114 do not affect the signal charge stored at the sampling capacitors.

Since the noise charge stored into the sampling capacitors 160 and 170 is reset after signal sampling, there is no noise correlation between the operational phases OP1 and OP2. This means that the noise gain of two in the previous configuration disappears. Actually, noise reset switches 130 and 140 add new kT/C noise, but it is the same amount with operational phase OP1 as in the configuration of the integrator circuit 30 shown in FIG. 3.

Figure 6:
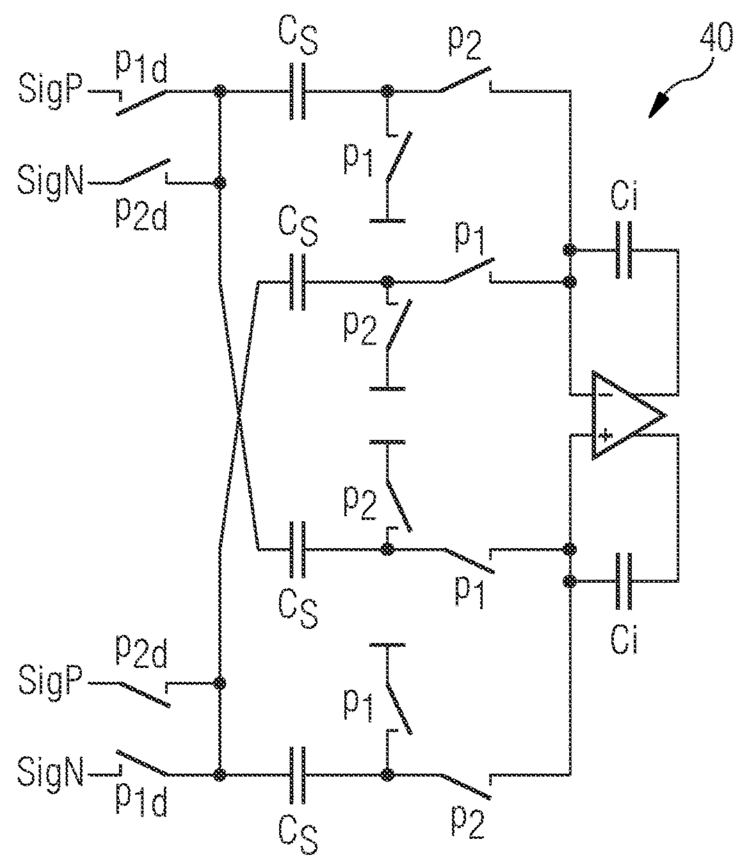
FIG. 6 shows an embodiment of a dual phase conventional SC integrator.

To do a fair comparison, a dual phase conventional SC integrator 40 is drawn as FIG. 6. In FIG. 6, signal charge transfers from sampling capacitors $C_s$ into integrating capacitors $C_i$ at both operational phases OP1 and OP2, and its amount is the same with the floating double sampling SC integrator of FIG. 2 and the embodiment of the integrator circuit 10 shown in FIG. 4. The capacitive load for the differential operational amplifier is also the same with the embodiment 20 of FIG. 2 and the embodiment of the integrator circuit 10 shown in FIG. 4 at both phases. So, the requirement for the differential operational amplifier is the same in all the cases, though the number of sampling capacitors is doubled.

Compared to the classical SC integrator 40 shown in FIG. 6, the configuration of the SC capacitor circuit 10 shown in FIG. 4 has the same gain and same SNR with a half number of sampling capacitors. Furthermore, in the configuration of the SC integrator circuit 10, the gain at operational phase OP1 and OP2 are completely matched even if the sampling capacitors have mismatch, while the mismatch in the sampling capacitors causes gain mismatch between the operational phases OP1 and OP2 in the classical SC integrators.

Compared to the floating double sampling integrator circuit 20 shown in FIG. 2, the embodiment of the integrator circuit 10 has the same gain and reduced SNR by more than 3 dB with same capacitors and only two additional controllable switches. Specifically, the input referred noise of the configuration of the integrator circuit 10 shown in FIG. 4 is down to $\sqrt{kT/2Cs}$, while that of the configuration of the integrator circuit 200 shown in FIG. 2 is $\sqrt{kT/Cs}$, wherein Cs specifies the capacitance of the sampling capacitors.

Furthermore, the additional controllable switches 113 and 114 are also working as biasing for the input nodes of the differential operational amplifier so that it is possible to be used alone, unlike the configurations of the integrator circuits shown in FIGS. 2 and 3.

Figure 7:
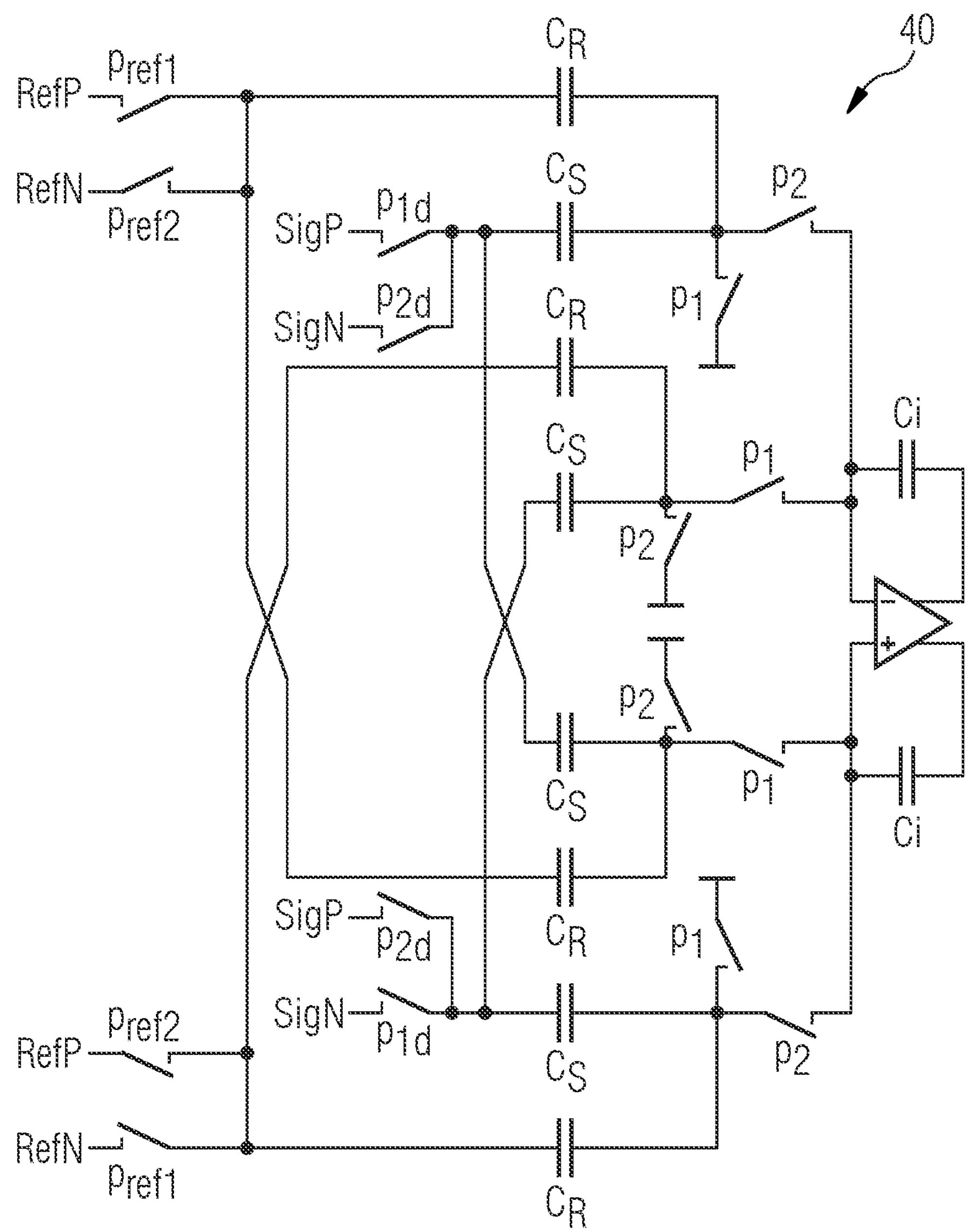
FIG. 7 illustrates a first stage of a sigma-delta modulator with a dual phase conventional SC integrator.
Figure 8:
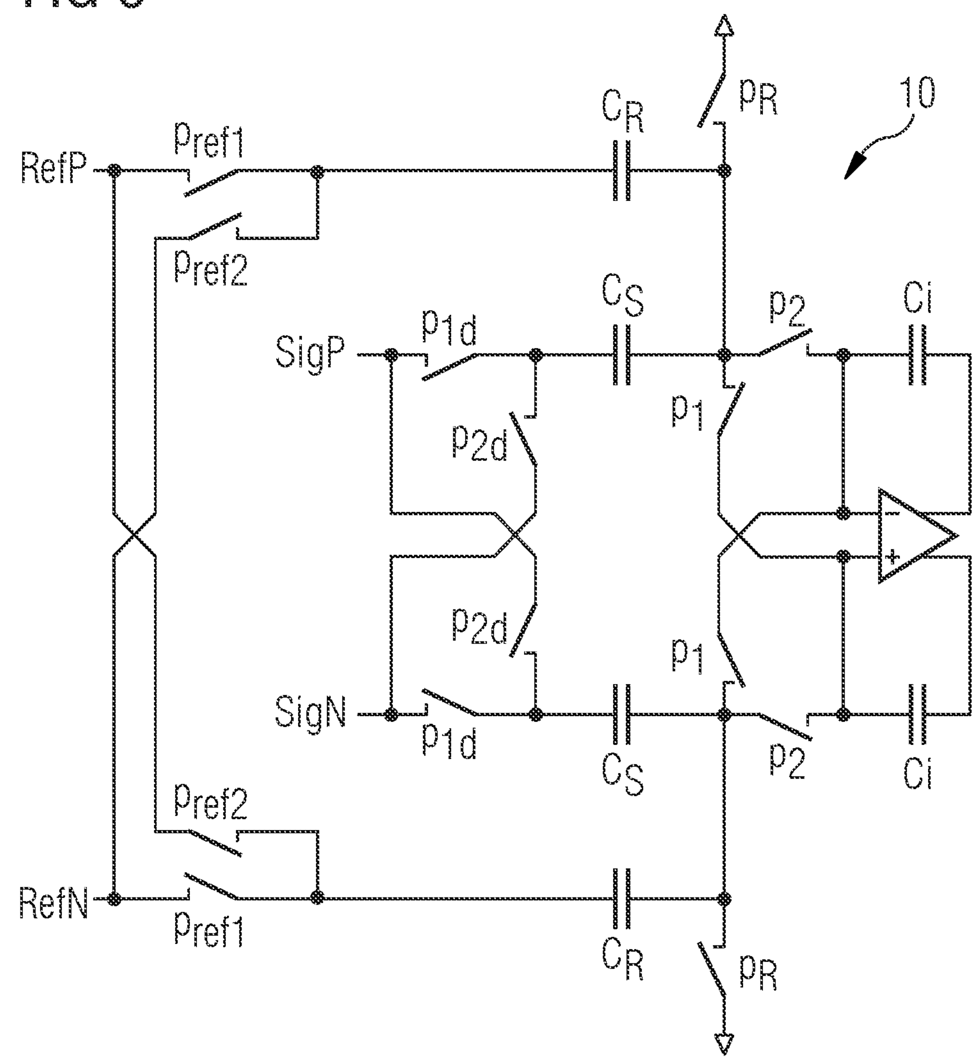
FIG. 8 illustrates a first stage of a sigma-delta modulator comprising an integrator circuit with noise reset switches.

FIGS. 7 and 8 shown two types of schematic of the $1^{st}$ stage integrator of a sigma-delta modulator (SDM) in order to compare the classical SC integrator of FIG. 6 and the embodiment of the integrator circuit 10 of FIG. 4. The capacitors $C_s$, 150 and 160 are capacitors for signal sampling and the capacitors $C_R$, 170 and 180 are capacitors for DAC feedback controlled by digital output of the quantizer.

FIG. 7 shows the $1^{st}$ integrator circuit 40 of the sigma-delta modulator which is implemented by dual phase classical SC integrator and explanation of clock timing for DAC feedback, while FIG. 8 shows an implementation comprises the integrator circuit 10 according to FIG. 4.

The two embodiments of the integrator circuits 10 and 40 have almost the same transfer function, same noise performance and same requirement for the differential operational amplifier, while the number of capacitors for sampling and DAC feedback is reduced by half and the circuit configuration can be much simpler. Moreover, since the number of capacitors are reduced, the load for the reference buffers for the signals RefP, RefN and analog ground, which are not shown in these figures, are reduced. As a result, power for reference buffers can be saved in the proposed configuration of the integrator circuit 10.

LIST OF REFERENCE SIGNS

1 sigma-delta modulator
10 integrator circuit
20 integrator circuit
30 integrator circuit
40 summation block
50 multi-bit quantizer
60 digital-to-analog converter
70 digital filter
110 switching controller
111, . . . , 120 controllable switches
130 differential operational amplifier
140 first integrating capacitor
150 second integrating capacitor
160 first sampling capacitor
170 second sampling capacitor
210 switching controller
211, . . . , 218 controllable switches
230 differential operational amplifier
240 first integrating capacitor
250 second integrating capacitor
260 first sampling capacitor
270 second sampling capacitor
310 switching controller
311, . . . , 318 controllable switches
330 differential operational amplifier
340 first integrating capacitor
350 second integrating capacitor
360 first sampling capacitor
370 second sampling capacitor

The invention claimed is:

1. An integrator circuit for use in a sigma-delta modulator, the integrator circuit comprising:

a first current path having a first signal input terminal configured to apply a first input signal, a second current path having a second signal input terminal configured to apply a second input signal, a differential operational amplifier with a first input node and a second input node, a switching network comprising:

a first set of controllable switches configured to selectively connect one of the first or the second input terminal to one of the first or the second input node of the differential operational amplifier, and a second set of controllable switches configured to couple the first and the second current path to a reference potential, a switching controller configured to control one of a conductive switching state or a non-conductive switching state of the first and the second sets of the controllable switches by generating switching signals during a first operational phase and a subsequent second operational phase of the integrator circuit, wherein the first input node of the differential operational amplifier is connected to the first current path and the second input node of the differential operational amplifier is connected to the second current path, wherein the first set of controllable switches comprises:

a first controllable switch arranged between the second input node of the differential operational amplifier and the first current path, and a second controllable switch arranged between the first input node of the differential operational amplifier and the second current path, wherein the second set of controllable switches comprises:

a third controllable switch arranged between a reference potential and the first current path, and a fourth controllable switch arranged between the reference potential and the second current path, wherein the switching controller is configured to generate a first switching signal, a delayed first switching signal, a second switching signal, and a delayed second switching signal for controlling the first set of controllable switches, wherein the delayed first switching signal is delayed in relation to the first switching signal, wherein the delayed second switching signal is delayed in relation to the second switching signal, and wherein the switching controller is configured to generate a third switching signal for controlling the second set of controllable switches independently from the generation of the first and the second switching signals and the first and the second delayed switching signals.

2. The integrator circuit of claim 1, comprising:

a first output terminal and a second output terminal configured to generate an output signal between the first and the second output terminals, and a first integrating capacitor and a second integrating capacitor, wherein the differential operational amplifier has a first output node connected to the first output terminal and a second output being connected to the second output terminal, wherein the first integrating capacitor is arranged between the first input node and the first output node of the differential operational amplifier, and wherein the second integrating capacitor is arranged between the second input node and the second output node of the differential operational amplifier.

3. The integrator circuit of claim 2, comprising:

a first sampling capacitor and a second sampling capacitor, wherein the first sampling capacitor is arranged in the first current path between the first signal input terminal and the first integrating capacitor, and wherein the second sampling capacitor is arranged in the second current path between the second signal input terminal and the second integrating capacitor.

4. The integrator circuit of claim 3, comprising:

a fifth controllable switch and a sixth controllable switch, wherein the fifth controllable switch is arranged in the first current path between the first integrating capacitor and the first sampling capacitor, wherein the sixth controllable switch is arranged in the second current path between the second integrating capacitor and the second sampling capacitor.

5. The integrator circuit of claim 4, comprising:

a seventh controllable switch and an eighth controllable switch, wherein the seventh controllable switch is arranged between the first signal input terminal and the first sampling capacitor, wherein the eighth controllable switch is arranged between the second signal input terminal and the second sampling capacitor.

6. The integrator circuit of claim 5, comprising:

a ninth controllable switch and a tenth controllable switch, wherein the ninth controllable switch is arranged between the second signal input terminal and a position of the first current path, said position of the first current path being located between the seventh controllable switch and the first sampling capacitor, wherein the tenth controllable switch is arranged between the first signal input terminal and a position of the second current path, said position of the second current path being located between the eighth controllable switch and the second sampling capacitor.

7. The integrator circuit of claim 6, wherein the switching controller is configured to generate the first switching signal with a first level during the first operational phase and the delayed first switching signal with the first level during the first operational phase, and wherein the switching controller is configured to generate the first switching signal and the first delayed switching signal with a respective second level during the second operational phase.

8. The integrator circuit of claim 7, wherein the fifth and the sixth controllable switches are configured to be controlled by the first switching signal, wherein the fifth and the sixth controllable switches are configured to be operated in the conductive switching state when the first switching signal is generated by the switching controller with the first level and to be operated in the non-conductive switching state, when the first switching signal is generated by the switching controller with the second level.

9. The integrator circuit of claim 7, wherein the ninth and the tenth controllable switches are configured to be controlled by the first delayed switching signal, wherein the ninth and the tenth controllable switches are configured to be operated in the conductive switching state when the delayed first switching signal is generated by the switching controller with the first level and to be operated in the non-conductive switching state when the delayed first switching signal is generated by the switching controller with the second level.

10. The integrator circuit of claim 5, wherein the switching controller is configured to generate the second switching signal with a first level during the second operational phase and the delayed second switching signal with the first level during the second operational phase, wherein the switching controller is configured to generate the second switching signal and the second delayed switching signal with a respective second level during the first operational phase.

11. The integrator circuit of claim 10, wherein the first and the second controllable switches are configured to be controlled by the second switching signal, wherein the first and the second controllable switches are configured to be operated in the conductive switching state when the second switching signal is generated by the switching controller with the first level and to be operated in the non-conductive switching state when the second switching signal is generated by the switching controller with the second level.

12. The integrator circuit of claim 10, wherein the seventh and the eighth controllable switches are configured to be controlled by the second delayed switching signal, wherein the seventh and the eighth controllable switches are configured to be operated in the conductive switching state when the delayed second switching signal is generated by the switching controller with the first level and to be operated in the non-conductive switching state when the delayed second switching signal is generated by the switching controller with the second level.

13. The integrator circuit of claim 1, wherein the switching controller is configured to generate the third switching signal with a first level during the first operational phase, when the first switching signal is generated with a second level and the delayed first switching signal is generated with the first level, and otherwise during the first operational phase with the second level, wherein the switching controller is configured to generate the third switching signal with the first level during the second operational phase, when the second switching signal is generated with the second level and the delayed second switching signal is generated with the first level, and otherwise during the second operational phase with the second level, wherein the third and the fourth controllable switches are configured to be controlled by the third switching signal, and wherein the third and the fourth controllable switches are configured to be operated in the conductive switching state when the third switching signal is generated by the switching controller with the first level and to be operated in the non-conductive switching state when the third switching signal is generated by the switching controller with the second level.

14. A sigma-delta modulator, comprising:

an input terminal configured to apply an analog input signal, a forward path comprising a summation block, a multi-bit quantizer and an integrator circuit as claimed in claim 1, and a feedback path comprising a digital-to-analog converter, wherein the summation block has a first input node being connected to the input terminal and a second input node being connected to the feedback path to receive an output signal of the digital-to-analog converter.

* * * * *